United States Patent
Chan

(10) Patent No.: US 7,334,203 B2
(45) Date of Patent: Feb. 19, 2008

(54) RACECHECK: A RACE LOGIC ANALYZER PROGRAM FOR DIGITAL INTEGRATED CIRCUITS

(75) Inventor: Terence Wai-kwok Chan, Dublin, CA (US)

(73) Assignee: Dynetix Design Solutions, Inc., Dublin, CA (US)

( * ) Notice: Subject to any disclaimer, the term of this patent is extended or adjusted under 35 U.S.C. 154(b) by 116 days.

(21) Appl. No.: 11/162,353

(22) Filed: Sep. 7, 2005

(65) Prior Publication Data

US 2006/0075367 A1    Apr. 6, 2006

Related U.S. Application Data

(60) Provisional application No. 60/615,108, filed on Oct. 1, 2004.

(51) Int. Cl.
*G06F 17/50* (2006.01)
(52) U.S. Cl. .................. 716/6; 716/18; 703/16
(58) Field of Classification Search ............ 716/5, 716/19, 18, 6; 703/16
See application file for complete search history.

(56) References Cited

U.S. PATENT DOCUMENTS

| | | | | |
|---|---|---|---|---|
| 5,901,061 | A * | 5/1999 | Gaddis et al. ............ | 703/16 |
| 6,018,624 | A * | 1/2000 | Baxter .................... | 703/16 |
| 6,097,884 | A * | 8/2000 | Sugasawara .............. | 716/4 |
| 6,466,898 | B1 | 10/2002 | Chan | |
| 6,496,966 | B1 * | 12/2002 | Barney et al. ............ | 716/10 |
| 6,625,788 | B1 * | 9/2003 | Vashi et al. .............. | 716/6 |
| 6,631,506 | B1 * | 10/2003 | Pie et al. ................. | 716/4 |
| 6,651,225 | B1 * | 11/2003 | Lin et al. ................. | 716/4 |
| 6,728,908 | B1 * | 4/2004 | Fukuhara et al. ......... | 714/48 |
| 6,785,873 | B1 * | 8/2004 | Tseng ...................... | 716/4 |
| 6,807,520 | B1 * | 10/2004 | Zhou et al. .............. | 703/14 |
| 6,907,599 | B1 * | 6/2005 | Kashai et al. ............ | 717/137 |
| 6,964,029 | B2 * | 11/2005 | Poznanovic et al. ...... | 716/7 |
| 7,162,703 | B1 * | 1/2007 | Aik ......................... | 716/5 |
| 2003/0144828 | A1 * | 7/2003 | Lin ......................... | 703/21 |

(Continued)

OTHER PUBLICATIONS

Josephs et al., "Modeling and Design of Asynchronous Circuits", Proceedings of the IEEE, vol. 87, No. 2, Feb. 1999, pp. 234-242.*
Huang et al., "An Extended Classification of Inter-instruction Dependency and Its Application in Automatic Synthesis of Pipelined Processors", Proceedings of the 26th Annual International Symposium on Microarchitecture, Dec. 1, 1993, pp. 236-246.*

(Continued)

*Primary Examiner*—Phallaka Kik
(74) *Attorney, Agent, or Firm*—Blakely, Sokoloff, Taylor & Zafman

(57) ABSTRACT

Techniques for performing static and dynamic race logic analysis on an integrated circuit (IC) are described herein. According to one aspect of the invention, HDL (hardware description language) design source files of an IC design are compiled into a common design database, including recording full timing information of the IC design. A static race logic analysis is performed on the common design database to reveal all possible race logic in the IC design. A dynamic race logic analysis could also be performed on the common design database to reveal times and circuit locations where the race logic would occur when a physical IC chip for the IC design is implemented. A race logic analysis report is generated for the static and/or dynamic race logic analysis, where the race logic analysis report is used to eliminate race logic errors in IC designs, so as to render highest quality IC products that will not exhibit intermittent random failures in field operations.

36 Claims, 7 Drawing Sheets

RaceCheck Process Flow

U.S. PATENT DOCUMENTS

| | | | |
|---|---|---|---|
| 2003/0182645 A1* | 9/2003 | Fairbanks | 716/5 |
| 2003/0188276 A1* | 10/2003 | Pie et al. | 716/4 |
| 2004/0088666 A1* | 5/2004 | Poznanovic et al. | 716/7 |
| 2004/0133409 A1* | 7/2004 | Mukherjee et al. | 703/14 |
| 2004/0139411 A1* | 7/2004 | Smith et al. | 716/7 |
| 2005/0125754 A1* | 6/2005 | Schubert et al. | 716/5 |
| 2005/0229123 A1* | 10/2005 | Wang et al. | 716/4 |
| 2006/0075375 A1* | 4/2006 | Rana et al. | 716/18 |
| 2006/0117274 A1* | 6/2006 | Tseng et al. | 716/1 |
| 2006/0277021 A1* | 12/2006 | Mithal et al. | 703/14 |
| 2007/0033551 A1* | 2/2007 | Greaves et al. | 716/3 |

OTHER PUBLICATIONS

Pozniansky et al., "Efficient On-the-Fly Detection in Multithreaded C++ Programs", Proceedings of International Parallel and Distributed Processing Symposium, Apr. 22, 2003, 8 pages.*

PCT/US05/34315, "Notification of Transmittal of the International Search Report and the Written Opinion of the International Searching Authority, or the Declaration", mailed on Jun. 21, 2007, 6pp.

* cited by examiner

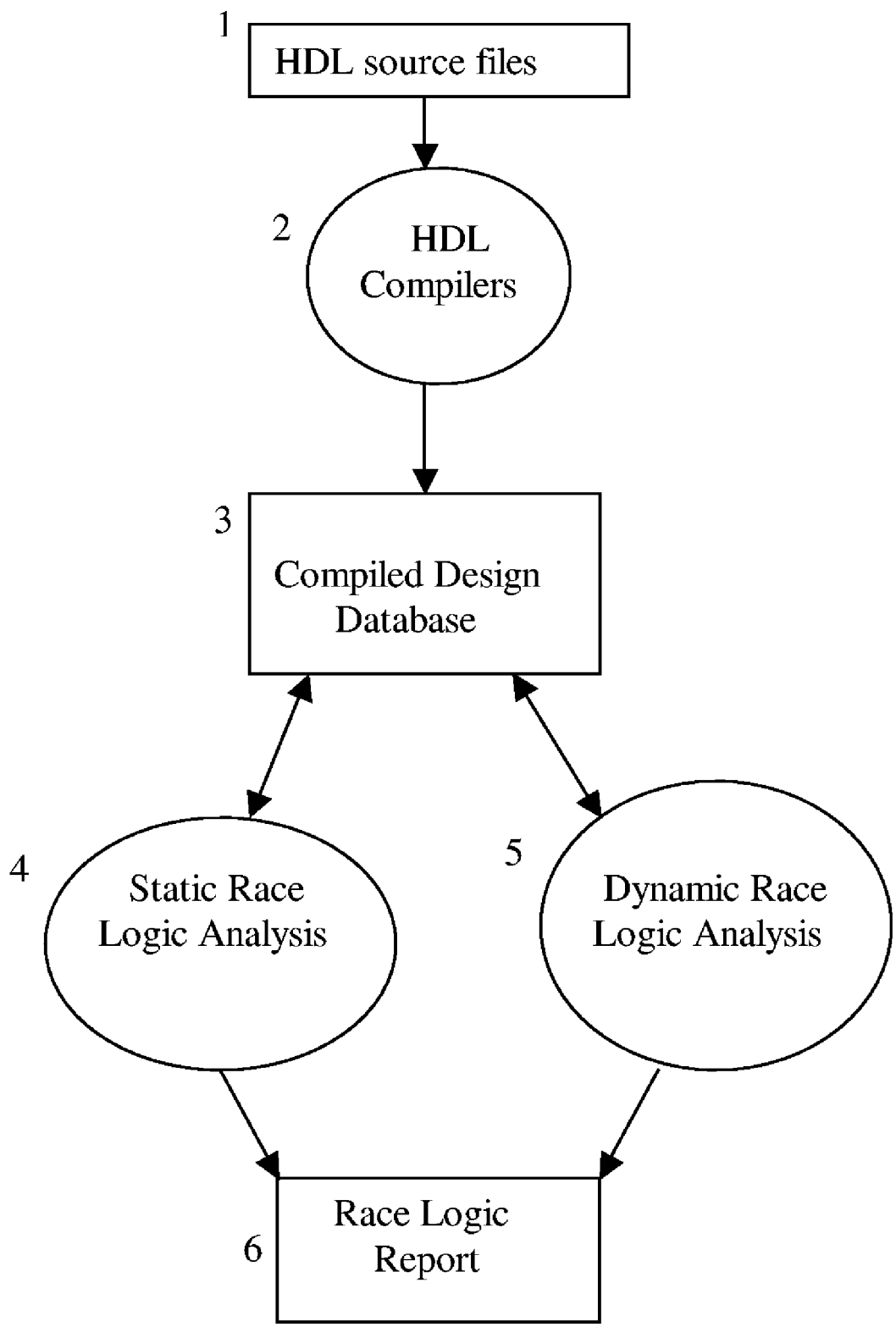
Figure 1. RaceCheck Process Flow

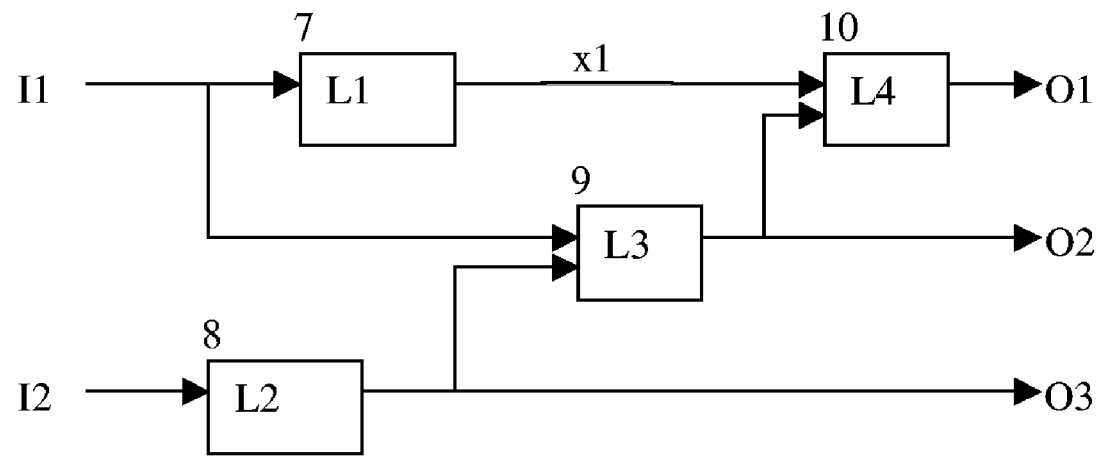
Figure 2. A Directed Graph Modeling an IC circuit

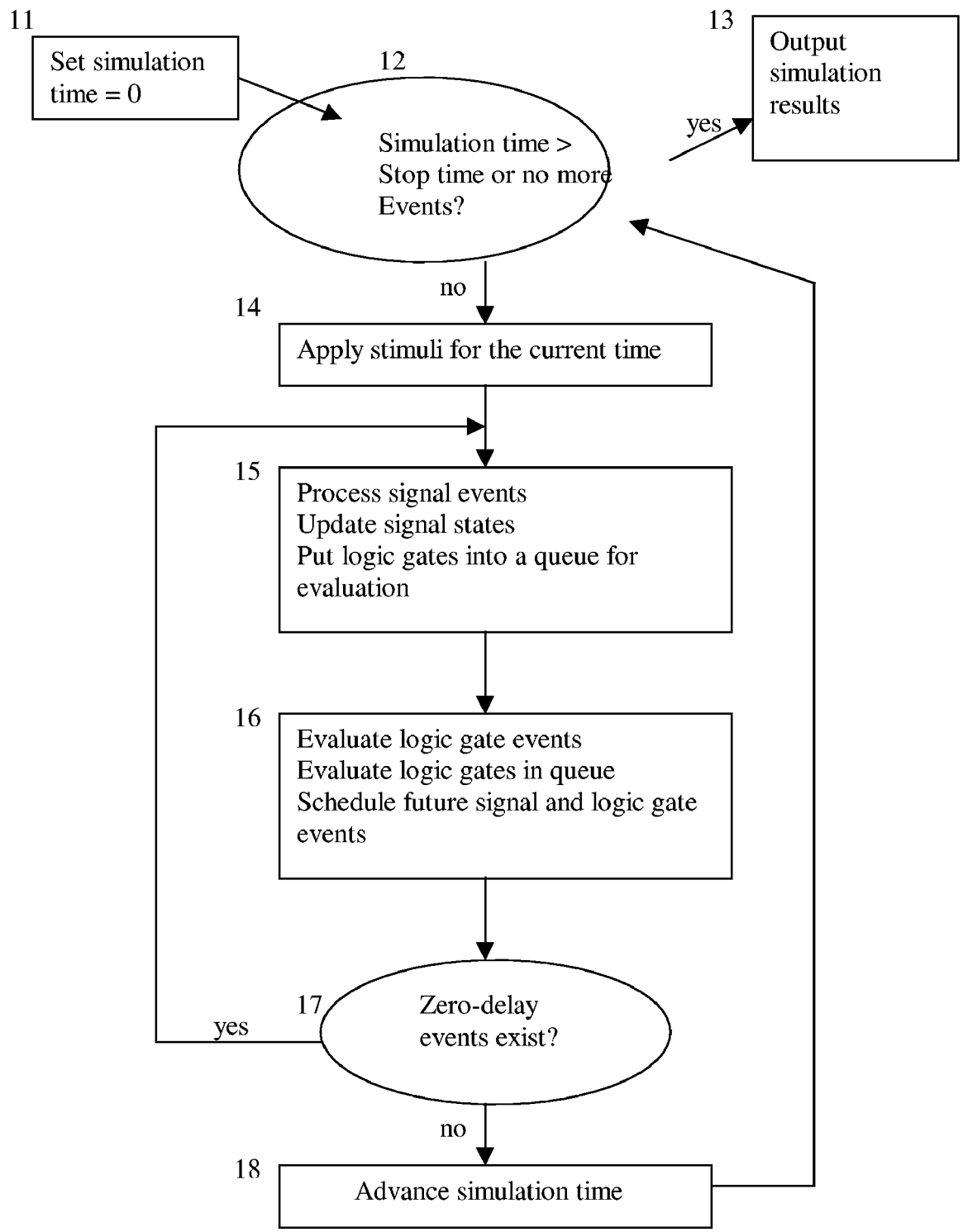
Figure 3. An Event-Driven Logic Simulation Process Flow

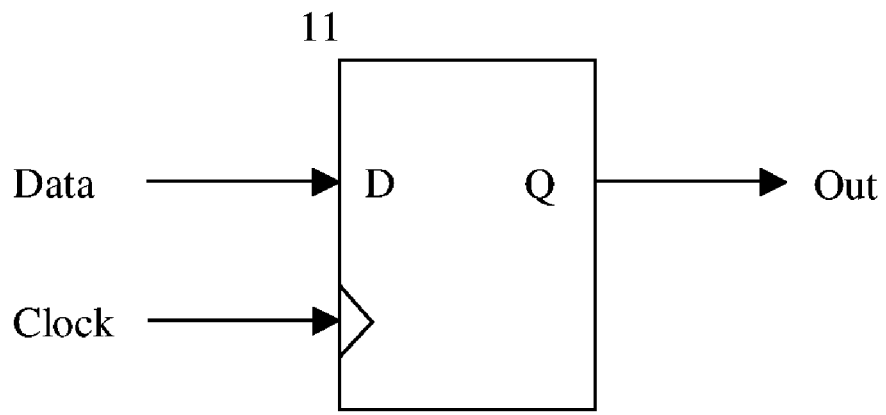
Figure 4. A Flip-Flop
Module test1 (input clock, reset, data, inout q);
    always @(posedge clock or negedge reset)
    If (~reset) q = #1 0;  else q = #2 data;
    always @)(posedge clock) q <= ~q;
endmodule
Figure 5. A Sample Logic Circuit

```
module test (input clk, a, b, output q);
    reg x;

always @(posedge clk) x = a ^ b;

always @(clk) if (x) q = 1; else q = 0;

endmodule
```

Figure 6. A Logic Circuit with Concurrent Assignment/Reference Race

```
module test (input clk, a, b, output q);
    reg x;

always @(posedge clk) x = a ^ b;

always @(clk or x)
        if (x) q = 1; else q = 0;

endmodule
```

Figure 7. A Circuit with No Concurrent Assignment/Reference Race

```
module test;
    reg a, b;
    wire x, y;

always @(a) x = $random;

always @(b) y = $random;

assign #5 a = ~a;

assign #10 b = ~b;

initial begin
        A= 0; b = 0;
    end
endmodule
```

Figure 8. A Logic Circuit with Concurrent Invocation of $random

```
module test( input clk, data);

task taskA;
        top.foo.sig = ~top.foo.sig;
    endtask taskB;
        top.foo.sig = data;
    endtask always @(posedge clk) taskA;

always @(clk) taskB;

endmodule
```

Figure 9. A Logic Circuit with Concurrent invocation of tasks

```
module top;

reg p;
    wire q;

assign q = p;

initial begin
        p = 0;
        #1 p = 1;
        %display(" q = ", q);
    end endmodule
```

Figure 10. A Logic Circuit with A Combinational Feedback Loop

```
module sub( input a, output reg q );

always @(a) q = ~a;

endmodule module top;
    reg c;
    wire a, b, d, e;

assign a = (b & c & e);

sub m1( a, d );
    sub m2( d, e );

assign b  = d ^ c ;
endmodule
```

Figure 11. A Logic Circuit with An Odd-Polarity Combinational Feedback Loop

RACECHECK: A RACE LOGIC ANALYZER PROGRAM FOR DIGITAL INTEGRATED CIRCUITS

DESCRIPTION

Most integrated circuit (IC) designers nowadays use hardware description languages (HDL) to design their new IC products. The most commonly used HDL languages are: VHDL (VHSIC Hardware description language), Verilog, SystemVerilog and SystemC. These languages have either been standardized (e.g., VHDL and Verilog) or are in the process of being standardized (e.g., SystemVerilog and SystemC) by the IEEE (Institute of Electrical and Electronic Engineering) society.

With the advance of the semiconductor process technology, IC chips' density and complexity increase exponentially. To date, an IC design manufactured in the 90-nanometer semiconductor process technology may contain several millions of transistors (e.g., Intel Corporation's Pentium™ microprocessor chips). When IC technology scales down to 60-nanometer or even 45-nanometer, an average IC chip density may reach several billions of transistors. The verification of these large-scale IC chips has become increasingly difficult and time consuming as chip density increases. It is now not uncommon for an IC chip design company to spend over 60% of a new product's development cycle solely on functional and timing verification of the new product, and that figure may increase to over 70% or more in the next few years.

In order to meet time-to-market for new IC products, IC chip design companies have been investing heavily (in the order of millions of dollars per year per design center) on state-of-the-art design verification tools. These include hardware description language (HDL) simulators, formal logic verification tools and static timing analyzers. Although these HDL verification tools have been proven effective in verifying the functional and timing correctness of IC designs, they are all incapable of, and were not designed for, catching one very important category of design error: race logic. Race logic is any circuit construct that will behave differently when evaluated in different orders. Race logic is caused by either oversight or inexperience of IC designers when they craft their IC designs, or when design modules created by different design engineers (or vendors) are stitched together to form the final IC design. If race logic is not caught and corrected in the IC product verification process, it will cause the actual IC chip to depict unpredictable behaviors when in field operations.

As an example of race logic, consider the following mathematical operations:

$$A = c+b;$$

$$D = A-1;$$

If the above two HDL statements are executed in the order as shown, the two variables A and D will be assigned the new value of (c+b) and (c+b−1), respectively. However, if the above two statements are executed in reverse order, then the value assigned to variable D will be the current value of variable A (which may not be the same as c+b) minus 1, before variable A is assigned the new value of (c+b). Furthermore, if the above two statements are executed concurrently, then the value assigned to D will be unpredictable, if the current value of A is not the same as (c+b).

An IC design typically executes most of its circuit operations in parallel, and HDL languages provide constructs for the user to specify concurrent operations in the HDL source of their IC designs, such as the parallel always block construct in Verilog and SystemVerilog. However, most HDL design verification tools either execute concurrent HDL constructs in tool-specific pre-determined orders (e.g., HDL simulators), or ignore timing dependency of circuit constructs altogether (e.g., formal logic verification tools, RTL analysis tools). Thus, it is uncommon for two IC design tools (e.g., HDL simulators) from two different vendors to yield different verification results on the same IC design and test-bench, because these two tools evaluate the IC chip circuit operations in different orders. The end result of using the current state-of-the-art design verification tools is that they give IC designers a false sense of confidence in the test coverage of their regression test suite. They commit their designs to manufacturing, and only to discover incorrect circuit behaviors when the chips are in manufacturing testing, or worse yet in field operations.

To remedy the lack of handling of race logic by the current HDL design verification tools, a new method has been invented to uncover race logic in IC designs. A new tool, the RaceCheck program, has been developed based on the new race logic audit technologies, The new tool will complement the existing HDL design verification tools (e.g., HDL simulators, formal logic verification tools, and static timing analyzers), to ensure IC product quality, and to reduce overall design verification time and effort, so that IC chip companies can meet time-to-market and improve their competitiveness.

The new race logic audit technologies and the RaceCheck program are described in the Section: Detail Description of the Invention.

I. BRIEF DESCRIPTION OF FIGURES

FIG. 1 depicts the basic operations of the RaceCheck program, and the input of data to the RaceCheck program from a user;

FIG. 2 shows a directed graph that represents a sample IC design that could be analyzed by the RaceCheck program;

FIG. 3 shows the process flow of an event-driven logic simulation; RaceCheck uses an event-driven simulation kernel to simulate the "real-life" operations of IC designs, and detects race logic in those circuits;

FIG. 4 shows a flip-flop, which is commonly found in digital IC designs;

FIG. 5 is a sample logic design, coded in the Verilog language, with potential race logic at the signal q;

FIG. 6 shows a sample logic design, coded in the Verilog language, that has concurrent assignment and reference race issue;

FIG. 7 shows a sample logic design, coded in the Verilog language, that has no concurrent assignment and reference race issue;

FIG. 8 shows a sample logic design, coded in the Verilog language, that has a race in the concurrent invocation of the Verilog/SystemVerilog $random built-in function;

FIG. 9 shows a sample logic design, coded in the Verilog language, that has a race in the concurrent invocation of Verilog/SystemVerilog user-defined tasks; and FIG. 10 shows a logic design, coded in the Verilog language, which has a combinational feedback loop.

FIG. 11 shows a logic design, coded in the Verilog language, which has a combinational feedback loop that will cause the circuit to run indefinitely.

II. DESCRIPTION OF THE BACKGROUND TECHNOLOGY

This section describes some of the background technologies that are important to the understanding of the race logic detection technology.

A. Circuit Models for Race Logic Analysis

Referring to FIG. 2, a user IC design is modeled as a directed graph consisting of a series of process blocks (or logic gates) connected by a set of signals. The process blocks (e.g., boxes L1 7, L2 8, L3 9 and L4 10 in FIG. 2) perform the logic operations of the IC design, such as addition, subtraction, multiplication, division, or memory read/write, whereas signals (e.g., I1, I2, x1, O1, O2 and O3 in FIG. 2) transport discrete logic data among process blocks. Signals in IC design may be single-bit or multiple-bits. A signal is a trigger signal of a process block if any changes in state of that signal will cause the process block to be evaluated (executed). A signal may trigger a process box when: its state changes from logic 0 to logic 1 (posedge trigger); its state changes from logic 1 to logic 0 (negedge trigger); whenever its state changes (anyedge trigger); or its state is either logic 1 or logic 0 (level-sensitive trigger).

In addition to the above, users may also specify propagation delays on process blocks and/or signals to model actual times consumed when those logic gates process data, and when data is transported from one end of a signal to the other end.

Furthermore, a circuit may contain one or more registers. Registers may be single- or multiple-bits. They are used to store data on a temporary basis. These data are later read and used in other circuit operations.

The aforementioned directed graph and propagation delays provide a realistic model of an IC design. The RaceCheck program compiles an IC design's HDL source files and creates a design database that contains a directed graph and the associated timing data for the IC design. The RaceCheck's static and dynamic race logic analysis routines then process the information in the design database to detect race logic in the corresponding IC design.

B. HDL Simulation Algorithm

The HDL simulation algorithm used in the RaceCheck dynamic analysis engine is based on an event-driven logic simulation algorithm[1]. RaceCheck may also use other logic simulation algorithms, such as cycle-based logic simulation (where timing delays of IC design elements are ignored), but the results will be less accurate. This is because many race logic manifest via simultaneous occurrence of certain events at specific simulation time points. Thus, without consideration of timing characteristics of circuit events, the detection of race logic will be less accurate.

Refer to FIG. 3, which depicts an event-driven logic simulation process flow. The simulation starts by setting the initial simulation time to zero, as indicated by box 11 in FIG. 3. It then checks, as indicated by box 12, if the current simulation time exceeds the user-specified maximum run time, or if there are no more circuit events pending to be evaluated. In either of the aforementioned situations, the simulation is completed (box 13), and the simulation results are generated and depicted to users.

However, if neither of the aforementioned situations is true, the simulator proceeds to process pending events at the current simulation time (box 14, 15 and 16). These new events are either input stimuli that are to be applied to the primary input and/or bi-directional signals of the circuit-under-test (CUT), or are scheduled events for the current time, due to some logic gates' evaluation at one or more prior simulation time points.

If an event to be processed is a signal event (box 15), the selected signal's state is first updated, then all the logic gates driven by this signal will be put into a queue, and these logic gates will be processed after all the current signal events have been processed.

Once all signal events are processed in the current time, any scheduled logic gate events, as well as logic gates in the queue, will be evaluated (box 16). This may result in some logic gates being processed at a future time (the logic gates are either sleeping for some user-specified time(s), or are waiting for one or more trigger signals to change states). Furthermore, one or more output signals of those logic gates may also be scheduled to change state in a future time. All these generate new events, which will be processed as the simulation progresses forward in time.

After all signal and logic gate events are processed, the simulator will then check (box 17) if there are any scheduled zero-delay events. If there are pending zero-delay events, the simulator starts a new iteration (at the same simulator time) to process those zero-delay events (box 17 transitions to box 15); otherwise, the simulator will advance the simulation time (box 18) to the next simulation time point. Then, it repeats the aforementioned simulation process (box 12-18) all over again.

C. Static Race Logic Analysis

Static race logic analysis program traverses the directed graph (e.g., FIG. 2) of a CUT, and detects race logic in the CUT based solely on the structural and time description of the directed graph. No test bench (test pattern) is required. Static race logic may be used in any stage of an IC design cycle, from IC design module development (pre test bench generation phrase) to final regression testing phase (where test benches for the CUT are available). Static Race logic analysis detects the following race logic in a CUT:

Concurrent assignment race events on circuit signals

Concurrent assignment and reference race events on circuit signals

Concurrent invocation race for the Verilog/SystemVerilog $random system function Concurrent invocation race for any user-defined tasks and functions Zero-delay combinational feedback loops Static race logic analysis generally gives more comprehensive race logic detection results than dynamic race logic analysis, and it runs much faster than dynamic race logic analysis. However, some of the race logic detected by the static race logic analysis may not manifest in the actual CUT field operations because the stimuli to the CUT's chip may not activate all logic in the chip.

D. Dynamic Race Logic Analysis

Dynamic race logic analysis program uses an event-driven logic simulation kernel to simulate the CUT field operations, based on a given user-supplied test bench. It can be applied to a CUT after the IC design is completed, and one or more test benches for the CUT are available. The dynamic race logic analysis program monitors all circuit events throughout the simulation run, and detects the following concurrent race logic in the CUT:

Concurrent assignment race events on circuit signals

Concurrent assignment and reference race events on circuit signals

Concurrent invocation race for the Verilog/SystemVerilog $random system function Concurrent invocation race for user-defined tasks and functions Since dynamic race logic analysis simulates the "real-life" operations of the CUT, it generally gives more precise race logic detection results than static race logic analysis does. Thus, all race logic reported by the dynamic race logic analysis program will likely manifest in the CUT's chip field operations. However, since event-driven simulation process is time-consuming, the dynamic race logic analysis program tends to run much slower than that of the static race logic analysis program. Furthermore, the race logic analysis results are highly dependent on the quality of the user-supplied test benches.

III. DESCRIPTION OF PRIOR ARTS

The most commonly used HDL design verification tools for IC designs are:
 (1) Simulation-based verification tools: these include software HDL simulators running on general-purpose computers, or HDL simulators running on proprietary hardware (hardware accelerators or hardware emulators). These tools require users to supply a set of test benches to drive each CUT. The HDL simulators running on either general-purpose computers or dedicated hardware accelerators verify both the functional and timing correctness of IC designs. However, HDL simulators running on dedicated hardware emulators verify only the functional correctness of IC designs, but not timing correctness. HDL simulators mimic the actual IC chip operations in the field, and are the preferred design verification tools for IC designers. Unfortunately, these tools simulate IC design operations in different tool-specific, pre-determined orders, and they frequently mask race logic effects in the verification process. Thus, they give users a false sense of confidence in the overall test coverage of their test benches. All HDL simulators providing checking for a simple type of race logic as shown in FIG. 4: setup and hold violations at flip-flops (and latches) in a CUT. Refer to FIG. 4, if the data input to a flip-flop changes state simultaneously as the clock input of the flip-flop changes to active state (e.g., from a '0' state to a '1' state), the flip-flop may latch in either the previous data input state, or the new state, and the state of the flip-flop output (Q) will be undetermined. Thus, a common design practice is to require that the data input of a flip-flop (or latch) must be stable at a certain period of time (the setup time) prior to clock input changes to active state. Furthermore, the data input must remain stable for a certain period of time (the hold time) after the clock input has changed to active state. Users may specify the setup and hold times for individual flip-flop and latches in a CUT, and the HDL simulators (except those running on hardware emulators, which they do not perform timing simulation) will check for setup and hold timing violations in CUT.
 (2) Formal logic verification tools: these tools extract the logic functions of a CUT and compare them to the design specification. No timing characteristic of the CUT is analyzed. The tools report any discrepancies between the implemented logic and the specification. They do not check for race logic in IC designs.
 (3) Static timing analyzers: these tools check the timing characteristics of IC designs. They do not verify functional correctness of CUT. The only race logic checking they perform is to check for setup and hold timing violations (see FIG. 4) at flip-flops and latches, as those performed by HDL simulators.
 (4) RTL (register transfer language) analysis tools: these are a new set of design verification tools to complement the HDL simulation and formal verification tools. These tools analyze IC designs' logic constructs statically and report any potential errors in the design (e.g., un-testable logic due to difficulty in controllability or observe-ability, or will yield errors when run in multiple clock domains). Some of these tools provide very limited race logic checking (concurrent assignments to signals, concurrent assignment and reference of signals), but since they do not make use of detailed timing characteristics of signals to filter out false violations, their results are neither complete nor accurate. Furthermore, they do not provide dynamic race logic analysis capability.

In summary, the aforementioned prior arts do not:
 (1) Support dynamic race logic analysis where race logic events are detected during event-driven logic simulation[1];
 (2) Provide both static and dynamic race logic analysis capabilities;
 (3) Use CUT's detailed timing information or formal methods (e.g. ATPG[2,3] or BDD[4,5]) to filter out false violations;
 (4) Audit concurrent invocation of the Verilog/SystemVerilog $random system function;
 (5) Audit concurrent invocation of user-defined tasks and/or functions.

IV. DETAILED DESCRIPTION OF THE INVENTION

As defined in Section I, race logic is any circuit construct that may behave unpredictably when it is executed in different orders. This invention will depict new technologies that will reveal hard-to-detect race logic, which is not covered by the current HDL design verification tools.

Specifically, the invention technologies will uncover the following types of race logic:
 Concurrent assignment to the same circuit signals in a CUT
 Concurrent assignment and reference of signals in a CUT
 Concurrent invocation of user-defined tasks or functions which may lead to concurrent assignment or concurrent assignment and reference of one or more signals in a CUT
 Concurrent invocation of the Verilog and SystemVerilog $random system function
 Zero-delay combinational logic loops in a CUT Furthermore, all the above checking can be done statically and/or dynamically.

The process flow of the RaceCheck program to perform static and dynamic race logic analysis, as according to the invention, is depicted in FIG. 1. Specifically, a CUT's HDL design files (box 1) are first compiled (box 2) into a design database, and any hierarchical net list constructs are flattened (box 3). Then, the static and/or dynamic race logic analysis engines (box 4, 5) may be invoked to detect race logic events in the CUT. Once the analysis is completed, any detected race logic will be reported to users (box 6).

The static race logic analysis is performed based on the structural and timing description of a CUT. No test vector is needed. It reports, comprehensively, all possible race logic that may occur in the CUT. In order to improve accuracy, it uses both the functional and timing relationships of signals (as described in the CUT's HDL source), as well as formal methods (ATPG and BDD) to filter out race logic that is not valid. Thus, it minimizes the reporting of false violations.

The dynamic race logic analysis uses an event-driven HDL simulation engine to perform logic simulation of a CUT, based on a user-supplied test bench. During simulation, it detects and reports any race logic that may occur in any simulation time point. The results of the dynamic race logic analysis are more precise than that of static race logic analysis, as it uncovers "real-life" race events that will manifest in the CUT chip field operations. However, the quality of the dynamic race logic analysis results is largely dependent on the quality of the user-supplied test benches.

V. STATIC RACE LOGIC ANALYSIS TECHNOLOGY

This section describes the detailed technology of static race logic analysis that has been implemented in the RaceCheck program.

A. Check for Concurrent Assignment Race for Signals and Registers

The static race logic analyzer examines each signal and register in the CUT design database (box 3 in FIG. 1). If a signal or register has either multiple drivers (sources) or has both driver (source) and receiver (sink) blocks, the static race logic analyzer will collect the following information for each source block of that "target" signal or register:

The trigger signal of the source block.

The trigger type of the trigger signal (posedge trigger, negedge trigger, anyedge trigger, or level-sensitive trigger).

Any time delays in assigning a new state to the target signal in the source block.

Any conditions (boolean expressions) which may enable or disable the assignment of a new state to the target signal in the source block.

The target signal is driven by blocking or non-blocking assignment(s) in the source block. A blocking assignment requires that the assignment action must be completed before other circuit events can be processed, whereas a non-blocking assignment permits other circuit events to be processed concurrently.

If there are multiple trigger signals in the source blocks, the above data will be collected for each of those trigger signals. If there are multiple delayed assignments in the source block for the same target signal, only the earliest delayed assignment will be recorded. If there are both blocking and non-blocking assignment actions for the same target signal in the source block, the blocking assignments will take precedence over the non-blocking ones. If there are multiple conditions imposing different conditional assignments for the target signal in the source block, replicate the above data (trigger signal, trigger type, delay, blocking or non-blocking assignment) for each condition.

To illustrate the above process, refer to FIG. 5, which depicts a sample IC design (a clock-triggered flip-flop) coded in the Verilog language. There are two "always" blocks in the circuit; both drive (assign new values to) the same signal q.

For the first "always" block, which is triggered by either the positive-edge of the signal clock, or the negative-edge of the signal reset, the following three sets of data are collected for the signal q:

| Event Set ID | 1 | 2 | 3 |
|---|---|---|---|
| Trigger Signal | clock | clock | reset |
| Trigger Type | posedge | posedge | negedge |
| Enable condition | Reset != 0 | Reset == 0 | Always on |
| Delay | 1 time unit | 2 time unit | 2 time unit |
| Blocking assignment | Yes | Yes | Yes |
| Driver object | Data | 0 | 0 |

For the second "always" block in FIG. 5, which is triggered by the positive edge of the signal clock only, the following data set is collected for the signal q

| Event Set ID | 4 |
|---|---|
| Trigger Signal | Clock |
| Trigger Type | posdedge |
| Enable condition | Always on |
| Delay | 0 |
| Blocking assignment | No |
| Driver object | ~q |

To determine if there is any concurrent assignment race for the signal q in the CUT, each of the three sets of data (set 1, 2 and 3) collected for the first "always" block in FIG. 5, is compared against the data set 4, which is collected for the second "always" block in FIG. 5.

Let's designate the following symbols:

| Symbol | Use |
|---|---|
| $S_x$ | The trigger signal of Set X |
| $T_x$ | The trigger type of Set X |
| $E_x$ | The enable condition of Set X |
| $D_x$ | The assignment delay time of Set X |
| $B_x$ | The blocking/non-blocking assignment type of Set X |
| $O_x$ | The driver signal(s) of Set X. |

A concurrent assignment race occurs if two data set X and Y are found to be "compatible", which means that all of the following conditions are met between the two sets:

(1) The events $\{S_x, T_x\}$ and $\{S_y, T_y\}$ are "compatible," such that the two events could be active simultaneously at one or more times during the CUT operations. This implies that the two "always" blocks triggered by the signals $S_x$ and $S_y$, respectively, could be simultaneously active, and thus race logic may occur on signals that are driven by both of these process blocks. The events $\{S_x, T_x\}$ and $\{S_y, T_y\}$ are compatible if any one of the following conditions is true:

$S_x$ is the same signal as $S_y$, and $T_x$ is not "posedge" (positive-edge trigger, which means the signal is active when the it changes state from logic 0 to logic 1), while $T_y$ is "negedge" (negative-edge trigger, which means the signal is active when it changes state from logic 1 to 0), or vice versa.

$S_x$ is not the same signal as $S_y$, and $S_x$ and $S_y$ can be independently set to the same or different logic states by some input stimuli to the CUT. In this case, the values of $T_x$ and $T_y$ are ignored.

Refer to the above data sets as collected for the circuit in FIG. 5, $\{S_1, T_1\}$ is compatible with $\{S_4, T_4\}$, $\{S_2, T_2\}$ is compatible with $\{S_4, T_4\}$, and $\{S_3, T_3\}$ is compatible with $\{S_4, T_4\}$.

(1) $E_x$ and $E_y$ are not mutually exclusive conditions. This means that there exist some input stimuli to the CUT that could set both $E_x$ and $E_y$ to logic 1. One method to prove that $E_x$ and $E_y$ are not mutually-exclusive conditions is to apply an automatic test pattern generation (ATPG) technique[2,3] to derive one or more input stimuli for the CUT that will justify the condition: $E_x$~^$E_y$, where "~^" is the logical operation "exclusive-nor". If the APTG fails to generate a test pattern for $E_x$~^$E_y$, it means that $E_x$ and $E_y$ are mutually exclusive conditions.

(2) $D_x$ is the same as $D_y$.

(3) $B_x$ is the same as $B_y$, if $D_x$ and $D_y$ are both zero data. If $D_x$ and $D_y$ are non-zero data, then the values of $B_x$ and $B_y$ are ignored.

(4) $O_x$ and $O_y$ are not logically equivalent. This means that Ox and Oy can be set to different logic states by some input stimuli to the CUT. This can be verified by applying the ATPG technique to see if any test patterns can be generated for the logic $O_x$^$O_y$, where "^" is the logical operation "exclusive-or". If no test patterns can be generated for $O_x$^$O_y$, it means $O_x$ and $O_y$ are logically equivalent signals. An alternative method to determine if $O_x$ and $O_y$ are logically equivalent is to build a binary decision diagram (BDD) [4,5] for $O_x$ and $O_y$, respectively, then compare the BDD diagrams for the $O_x$ and $O_y$. If the two diagrams are equivalent, then $O_x$ and $O_y$ are logically equivalent.

The goal of the aforementioned rules is to ensure that two sets of triggering conditions, as found in two process (always) blocks driving the same signal, could happen simultaneously during the circuit operations, and that they will drive different signal states to the same signal concurrently.

Referring to the example in FIG. 5, because $D_1$ and $D_4$ are not the same applying the aforementioned rules to Set 1 and Set 4 will not cause simultaneous assignments to the signal q. The same applies for Set 2 and Set 4.

However, race logic may occur between Set 3 and Set 4, as the combination of "negedge Reset", 2 time units delay and a driving state of 0 may occur at the same time as that of "posedeg clock" when ~q has the logical value of 1.

Note that after two process blocks are identified to have a concurrent assignment race for a circuit signal or register, the relationship between the two process blocks driving the signal or register need to be verified as not "related", otherwise the race event is false. Two process blocks are "related" if the execution of one block is caused by the execution of the other block. For example, if one block is a task or function call, and that task or function is called by the other block, then the execution of the two blocks are actually sequential (at zero time delay), and thus no race could occur from the executions of these two blocks. Other examples are: one block is triggered by a Verilog (or SystemVerilog) event object which is being "raised" (activated) by the other block; one block is a Verilog (or SystemVerilog) forked child process, and the other block forks the child process; and finally, one of more output signals of one block are the trigger signals of the other block.

B. Check for Concurrent Assignment and Reference Race of Signals and Registers

This is the most common occurrence of race logic as found in IC designs. It is similar to the setup and hold races of a flip-flop (see FIG. 4), where the data and clock inputs of the device change states simultaneously. The only difference between the two races is: the device in a concurrent assignment and reference race is a process block, whereas the setup/hold race involves flip-flops only. Furthermore, the process block (in a concurrent assignment and reference race) is triggered by one or more signals, and the data input is either a primary input of a CUT, or it is driven by another process block, which happens to drive the data signal while one or more trigger signals of the former process block is also active at the same time.

For example, refer to FIG. 6, the register x is assigned a new value whenever the signal clk changes state from logic 0 to logic 1, and the same register x's value is tested whenever the signal clk changes states, to determine the new value to be assigned to the signal q. Thus, at a positive edge of signal clk, both "always" blocks will be activated simultaneously. If at that time the first "always" block were to assign a new value to signal x, then there is a possibility that register x's state is being tested in the second "always" block while its state is simultaneously being changed by the first always block. The result of this concurrent assignment and reference race is that the signal q state may be assigned a wrong value, depending on whether the second process block tests register x's old state or the latest state.

To detect concurrent assignment and reference race on each signal and register in a CUT, the triggering data sets for each driver (source) process block of a signal or register are collected, as shown in Section V-A. Then the triggering data sets for each (sink) process block driven by the signal or register are also collected. Once that information is gathered, each trigger data set from the source process block(s) of the signal or register is compared against each and every trigger data set of the sink process block(s). If a pair of trigger data set is shown to be "compatible" (i.e., both source and sink triggering conditions may be active simultaneously at one or more times throughout the course of the CUT operations), then a concurrent assignment and reference race is recorded for the target signal or register, with respect to the identified source process block and the sink process block.

Refer to FIG. 6, the following trigger data set is collected for the driver (source) process block for register x:

| Event Set ID | 1 |
| --- | --- |
| Trigger Signal | Clk |
| Trigger Type | posedge |
| Enable condition | Always on |
| Delay | 0 |
| Blocking Assignment | No |
| Driver object | A ^ B |

And the following trigger data set is collected for the driven (sink) process block for register x:

| Event Set ID | 2 |
| --- | --- |
| Trigger Signal | Clk |
| Trigger Type | anyedge |
| Enable condition | Always on |
| Delay | 0 |
| Blocking Assignment | No |
| Driver object | None |

By comparing data set 1 and 2, the register x may be assigned a new state by data set 1, and its state may be referenced by the data set 2, simultaneously at every positive-edge of the signal Clk. Thus, a concurrent assignment and reference race is detected for x.

Note that if a signal or register is a trigger signal for a sink process block, then that process block will be excluded from the concurrent assignment and reference race consideration. This is because whenever the signal or register changes states, that sink process block will be re-evaluated, and there will be no concurrent assignment and reference event for the target signal or register. For example, FIG. 7 is similar to the example in FIG. 6. However, since register x is a trigger signal for the second (sink) process block, there is no concurrent assignment and reference race in this circuit.

Finally, as described in Section V-A, if a source process block and a sink process block for a signal or register are "related", then there is no race generated by the two blocks, as they are actually being executed sequentially.

C. Check for Concurrent Invocation Race for the $Random System Function $random is a Verilog and SystemVerilog built-in function [6] which returns a 32-bit pseudo-random number each time it is called in the user's HDL code. It is "pseudo-random" because it always return the same series of "random" numbers given an initial (or default) seed value. This is to ensure that a test bench which replies on the $random function to generate stimuli to a CUT will always create the same set of input stimuli to, and hence will receive the same set of expected response from the CUT, across repeated runs of the same test bench and CUT.

The $random function keeps an internal 32-bit integer variable which holds the latest seed value. The seed can be set by a user in a $random call by passing an optional 32-bit integer data as the actual argument to the function call. The $random function uses its current seed variable to compute the new "random" number to be returned; it also updates its seed variable for the next call. Thus, $random will return a deterministic set of "random" numbers if it is called sequentially by the user's HDL source. However, if the user's HDL code called the $random function concurrently, then the data returned will be indeterminate, as the $random functions' internal seed variable is being concurrently assigned (updated) by the concurrent $random calls.

To detect concurrent invocation of the $random function, the RaceCheck program keeps track of all process (always, initial, user-defined task, user-defined function, or forked child process) blocks in a CUT that invoke the $random function. If there are multiple such process blocks, the trigger data sets for each of those blocks are collected (see Section V-A), and the data sets between each pair of blocks are compared in the exact same manner as described in Section V-A. If two trigger data sets from two different process blocks are found to be "compatible", such that the $random functions may be called by these two blocks concurrently at some point during the CUT operations, RaceCheck will flag an error warning users of such an issue.

FIG. 8 shows a sample circuit which has a concurrent invocation race for the $random function, whenever both signals a and b change states (at every multiple of 10 ten units).

D. Check for Concurrent Invocation of User-Defined Tasks or Functions

Verilog and SystemVerilog allow user-defined tasks and functions to reference signals and register variables that are defined beyond the tasks/functions scope. For example, a task or function may make references or assignments to "external" signals or register variables that are defined in either the same module which contain the declaration of the task or function, or in some other modules, which are instantiated in other part of the CUT. These tasks and functions are said to contain "side-effects." This is because whenever they are called, they may reference or modify external signals or register variables.

For tasks and functions that have no "side-effects," multiple process blocks can invoke them concurrently with no race issue. However, concurrent invocations of tasks of functions that have "side-effects" may result in concurrent assignments, or concurrent references and assignments of external signals and/or registers. Thus, RaceCheck needs to keep track of the invocations of tasks and functions which have "side-effect," in the same manner as keeping tack of the $random function calls (see Section V-C), to ensure that these tasks and functions are not called concurrently during the CUT operations. Otherwise, RaceCheck will report a concurrent invocation race of those tasks and functions.

FIG. 9 shows a sample circuit, which has concurrent invocation of taskA and taskB, whenever the signal Clk changes states from logic 0 to logic 1. Since taskA and taskB have "side-effects", the concurrent invocation of these tasks will result in a concurrent assignment and reference race for the external signal top.foo.sig.

E. Check for Zero-delay Combinational Feedback Loops

Combination feedback loop is a zero-delay logical path, which spans across two or more circuit elements. Refer to FIG. 10, which is a combinational feedback loop example as depicted in the IEEE 1364-2005 Verilog language manual. The combinational loop in FIG. 10 consists of: the assignment statements of signal p in the initial block; the "continuous" assignment statement of signal q by p; and the $display statement in the initial block which depicts the signal q's state. When the circuit in FIG. 10 is executed, at time 1 signal p is assigned the logic state of 1, but the subsequent print out of the signal q's state, via the $display statement, could be logic 1 or 0, depending on whether the "continuous" assignment of signal q is executed prior to, or after the $display statement. Thus, the zero-delay combinational loop causes a concurrent reference and assignment race with respect to signal q.

Added to the above, if the overall inversion polarity of a combinational loop path is odd, once that path is enabled the CUT may be stuck in executing that loop indefinitely, and will not be able to execute other circuit functions, nor can it be shut down gracefully.

Combinational feedback loops in IC designs may be introduced by oversight of a designers, or they could be introduced when different circuit modules, as designed by different designers or are obtained from different vendors, are stitched together to form a larger circuit, as is the common practice for System-on-Chip (SoC) designs.

Refer to FIG. 11, which shows a logic design containing a combinational feedback loop that has an overall odd inversion polarity. The combinational loop here is formed among signals a, d, e, and then a. When this circuit is executed, it'll hung as signal states are traveling in a circular path along a, d, e, and a, continuously at zero time delay.

To detect combinational feedback loops in a CUT, each signal in the circuit that has source and sink process blocks will be examined for its possible involvement in any combinational feedback loops. Specifically, the source process block(s) of the signal (says X) is traced, in backward fashion, to determine if any sink blocks, which are directly driven by X, will eventually be reached during the backward trace process. If this is found true, and that the detected circular path has zero delay, then RaceCheck will report the path to users as a combinational feedback loop.

In the path tracing process, the logical operations of each source process block of a signal being traced is examined, to see if there is one or more assignment statements in the process block that assigns new states to the target traced signal. For each of these assignment statements found, if it meets the following constraints:

(1) The statement has no delay and is a non-blocking assignment
(2) The driving logic (right-hand side argument of the assignment) consists of one ore more variables or signals which are connected either directly or indirectly to the primary input or bi-directional ports of the process blocks Then the following data are recorded for the statement:

(1) The primary input and/or bi-directional signals to the process block which drives the statement logic
(2) The inversion polarity of each of these input or bi-directional signals with respect to the target traced signal
(3) Any enabling conditions which may disable the execution of the assignment statement For each of the primary input or bi-directional signal recorded, if it is the original signal (i.e., Signal X), which was selected at the start of a path tracing, then the search is completed and a circular loop is detected; otherwise the signal becomes the new target trace signal, and its source process blocks are examined, in the aforementioned manner, to continue the backward trace process.

If a circular path is detected, and there is no enabling condition detected at any stage of the path, then the path can be reported to users as a combinational feedback loop. However, if there is one or more enabling condition found at some stage of the path, say C1, C2, and C3, then the following Boolean expression will be created:

$$S = C1 \text{ and } C2 \text{ and } C3$$

Where "and" is the logical and operator, and an ATPG algorithm will be invoked to prove that there exists some input stimuli to the CUT that can set all the enabling conditions in the circular path to be true simultaneously. If the ATPG result is positive, the path will be reported to the user as combinational feedback loop, otherwise, it is a false path.

To illustrate the aforementioned method, refer to FIG. 11, let signal a be the starting signal for a combinational path tracing. It is noted that signal a is driven by the Verilog assignment statement in the module top:

$$\text{assign } a = b \text{ \& } c \text{ \& } e;$$

Since the assignment statement is zero delay, non-blocking, and involves other signals (b, c and e) in the module top, the following data is recorded for the statement:

| Signals/Variables involved | B, c, e |
|---|---|
| Inversion | No |
| Enabling condition | Always on |

Each of the signals b, c and d will in-turn be selected as the next trace signal, and the source process block of each of these signals will be examined accordingly.

For signal b, it is driven by the following assignment statement in module top:

$$\text{assign } b = (d\char`\^c);$$

The following data will be recorded for the new statement:

| Signals/Variables involved | D, c |
|---|---|
| Inversion | No |
| Enabling condition | Always on |

To continue the path tracing, if signal c is traced next, it will be noted that signal c has no source process block, thus the trace is terminated with respect to c.

However, if signal d is selected, the source process block for that signal is the instance m1, which performs the following operation for its input signal (signal a) and output signal (signal d):

$$\text{always } @(a) \ d = \sim a;$$

And the following data are recorded for this process block:

| Signals/Variables involved | a |
|---|---|
| Inversion | Yes |
| Enabling condition | Always on |

Since signal a is the trigger signal for the process block m1, it can be selected to be a member of the circular path. Furthermore, as signal a was the chosen starting point of the path trace, a circular path is now detected which consists of these signals:

A to b, b to ~d, and ~d to A

Since there is no enabling condition that needs to be justified, the path can be reported to users as a combinational feedback loop. Furthermore, as the overall inversion polarity of the path is odd, the path can also be reported to users as an oscillating combinational feedback loop.

VI. DYNAMIC RACE LOGIC ANALYSIS TECHNOLOGY

To perform dynamic race logic analysis, an event-driven, full-timing, logic simulator[1] is employed to execute a user-supplied test bench (which contains stimuli and expected results) with a user CUT, and detects race logic events at every time tick during the simulation.

The advantages of dynamic race logic analysis over static race logic analysis are:

(1) It detects and reports only race logic that will occur in "real-life" circuit operations. It does not report all possible race events in a CUT, as the static race logic analysis does
(2) It depicts the exact times in CUT operations when race events occur, thus the results are more precise and useful to IC designers to debug and correct their circuit issues.

The drawbacks of dynamic race logic analysis versus static race logic analysis are:

(1) The quality of the dynamic analysis results is highly dependent on the quality of the test-benches as provided by users
(2) It may take more time to run dynamic analysis than the static race logic analysis, due to the slowness of the event-driven simulation.

The dynamic race logic analysis could detect the following race logic:

Concurrent assignment of a signal or register object
Concurrent assignment and reference of a signal or register object
Concurrent invocation of the $random system function
Concurrent invocation of user-defined tasks and functions which have "side-effects"

Note that combinational feedback loops, if present, will cause the event-driven simulation to run forever, thus they can only be detected by the static race logic checker program. Those combinational feedback loops must be corrected before the dynamic race logic checker program can analyze the CUT.

A. Check for Concurrent Assignment Race for Signals and Registers

To check for concurrent assignment race of a signal or register by multiple driving blocks, each time a signal (or register) is assigned a new state in a CUT, the following data is recorded for that signal:

| | |
|---|---|
| Event Time | Simulation time when the signal is assigned a new state |
| New state | The new logic state assigned to the signal/register |
| Driving block ID | The process block where the assignment occurred |

If two assignment events, X and Y, are detected to occur at the same simulation time for a signal (or register), and the new assigned states in X and Y are different, and the driving block IDs of X and Y are also different, then a concurrent assignment race is detected.

However, the relationship of the driving blocks in event X and Y must be examined, to ensure that are not "related". For example, if the driving block in event X forks a child process which executes the driving block in event Y, at the current simulation time where the signal is assigned new states, then there is no concurrent assignment race between the two blocks, as they are actually executed sequentially. Similarly, if the block in event X is a task, which is invocated by event Y, at the current simulation time where the signal is assigned a new state, then there is no concurrent assignment race.

B. Check for Concurrent Assignment and Reference Race for Signals and Registers

To check for concurrent assignment and reference race of a signal or register, each time a signal (or register) is assigned a new state, the following data is recorded for that signal:

| | |
|---|---|
| Event Time | Simulation time when the signal is assigned a new state |
| New state | The new logic state assigned to the signal/register |
| Driving block ID | The process block where the assignment occurred |

Furthermore, each time a signal or register object is being referenced in a process block, the following data is recorded for that object:

| | |
|---|---|
| Event Time | Simulation time when the signal or register object's state is being referenced |
| Driving block ID | The process block where the reference event occurred |

If an assignment and a reference event, X and Y, are detected to occur at the same simulation time for the same signal (or register), and one event is an assignment event and the other is a reference event, and the process block IDs in the two events are distinct (and determined to be not "related", as described in Section VI-A), then a concurrent assignment and reference event is detected for the target signal (or register).

However, to ensure accuracy, the target signal is checked to make sure that it is not a trigger signal for the process block where the reference event occurs, otherwise the two events X and Y are actually executed sequentially, and thus there is no race.

C. Check for Concurrent Invocation Race of the $Random System Function

To check for concurrent invocation of the $random system function, each time the system function is invoked, the following data is recorded:

| | |
|---|---|
| Event Time | Simulation time when the $random system task is invoked |
| Driving block ID | The process block where the invocation event occurred |

If two or more concurrent invocation events are detected for the $random system function, and the process blocks' IDs in these events are all unique, and the process blocks are determined to be "un-related" (see Section VI-A), then a concurrent invocation race of the $random system function is detected.

D. Check for Concurrent Invocation Race of the User-defined Tasks or Functions

To check for concurrent invocation of the user-defined tasks and functions, which have "side-effects" (see Section V-D), each time any of these tasks or functions is invoked, the following data is recorded:

| | |
|---|---|
| Event Time | Simulation time when the task or function is invoked |
| Driving block ID | The process block where the invocation event occurred |

If two or more invocation events are detected, for the same task or function, or among different tasks or functions which modify and/or reference a common set of external signals, at the same simulation time points; and that the process blocks' IDs in these events are all unique, and those blocks are determined to be not "related" (see Section VI-A), then a concurrent invocation race of the tasks and/or functions is detected.

VII. REFERENCES

[1] "Distributed Automatic Test Pattern Generation", Terence Chan, IEEE Proceeding ASIC Conference, September 1992.

[2] "On the Acceleration of test Pattern Generation Algorithms", H. Fujiwara and T. Shimono, IEEE Transaction on Computers, Vol. C-32, No. 12, December 1983.

[3] "Multithreaded, Mixed Hardware Description Language Logic Simulation on Engineering Workstation", U.S. Pat. No. 6,466,898, Terence Chan, October 2002.

[4] "Formal Verification of Multi-Chip Designs", Terence Chan and Steve Hsiung, IEEE Custom Integrated Circuit Conference. September 1992.

[5] "Graph-Based Algorithms for Boolean Function Manipulation", R. E. Bryant, IEEE Transaction on Computers, Vol. C-35, No. 8, November 1986.

[6] "IEEE-1364 2001 Verilog Language Reference Manual", Institute of Electronic and Electrical Engineering Society, 2001.

What is claimed is:

1. A computer implemented method of performing race logic analysis on an integrated circuit (IC) design, the method comprising:
   (i) compiling HDL (hardware description language) design source files of an IC design into a common design database, including recording full timing information of the IC design;
   (ii) performing at least one of a static race logic analysis on the common design database to reveal all possible race logic in the IC design and a dynamic race logic analysis on the common design database to reveal times and circuit locations where the race logic would occur when a physical IC chip for the IC design is operating in field operations; and
   (iii) generating a race logic analysis report for the static and/or dynamic race logic analysis, wherein the race logic analysis report is used to reduce race logic errors in the IC design.

2. The method of claim 1 wherein performing the static race logic analysis comprises:
   (a) analyzing all circuit signals and registers to detect concurrent assignment races;
   (b) analyzing all circuit signals and registers to detect concurrent assignment and reference races;
   (c) analyzing all circuit process blocks that invoke HDL-defined system functions and tasks, and detect concurrent invocation of system functions and tasks that render concurrent assignment races, and/or concurrent assignment and reference races;
   (d) analyzing all circuit process blocks that invoke user-defined tasks and functions, and detect concurrent invocation of these tasks and functions that render concurrent assignment races and/or concurrent assignment and reference races;
   (e) analyzing all circuit signals, registers and process blocks to detect zero-delay combinational feedback loops.

3. The method of claim 2 wherein the operation of (a) further comprises:
   (f) examining each circuit signal or register object, and collecting driving factors for each driving (source) process block of the signal or register object;
   (g) once the driving factors for all driving process blocks of the signal or register object are collected, if there are multiple drivers for the signal or register object, confirming concurrent assignment races for the signal or register object by justifying that two or more driving factors for the signal or register object are compatible simultaneously, during the integrated circuit (IC) operations.

4. The method of claim 3 wherein the operation of (f) further comprises collecting the driving factors for each driving process block of a signal or register object, wherein the driving factors comprises: trigger signals to the driving process block; a trigger event type; possible delays in assigning a new state to the signal or register object; a type of assignment; possible enabling conditions which control the assignment event; and an assigned new state value or driving signals and/or registers.

5. The method of claim 3 wherein the operation of (b) further comprises checking if any two sets of driving factors for two distinct driving process blocks of a signal or register object are compatible simultaneously.

6. The method of claim 2 wherein the operation of (b) further comprises:
   (i) examining each circuit signal or register object that is connected to both driving (source) and driven (sink) process blocks;
   (j) collecting the driving factors for every driving and driven process block of the signal or register object;
   (k) once the driving factors for all driving and driven process blocks of the signal or register object are collected, ascertaining a concurrent assignment and reference race to the object by justifying that any pair of driving factors, one from a driving process block and the other from a driven process blocks, are compatible simultaneously at one or more times during an IC design operation.

7. The method of claim 6 wherein the driving factors of a driving process block comprise: trigger signals to the process block; a trigger event type; any delays in assigning a new state to the object; an assignment type; any enabling conditions which controls an assignment event; and an assigned state or driving signals and/or registers.

8. The method of claim 6 wherein the driving factors of a driven process block comprise: trigger signals to the process block; a trigger event type; any delays in referencing objects state; any enabling conditions which controls referencing of the object's state.

9. The method of claim 6 wherein the operation of (k) further comprises checking if any two sets of driving factors, including one from a driving process block and the other from a driven process block, of a signal or register object, are compatible simultaneously.

10. The method of claim 6 wherein the operation of (k) further comprises checking if the signal or register object under examination is among triggering signals of a driven process block and if so, excluding that driven process block in the concurrent assignment and reference race analysis.

11. The method of claim 2 further comprising:
    (l) identifying HDL-defined system functions and/or tasks that have a side-effect, and collecting triggering conditions of each process block in an IC design that invokes the system functions and/or tasks;
    (m) once all process blocks which invoke the system functions/tasks are identified and their triggering conditions are collected, ascertaining any concurrent invocation race of the system functions/tasks by justifying that two sets of triggering conditions from two different process blocks are compatible simultaneously.

12. The method of claim 11 wherein the operation of (l) further comprises collecting the following data as triggering conditions for a process block that invokes an HDL-defined system function/task that has a side effect: trigger signals to the process block, trigger event types, and any delays in invoking the system function/task.

13. The method of claim 11 wherein the operation of (m) further comprises justifying two sets of triggering conditions of two process blocks, which invoke the HDL-defined system functions or tasks, are compatible simultaneously.

14. The method of claim 2 wherein the operation of (d) further comprises:
   (n) identifying user-defined tasks and functions in an IC design, which have a side-effect;
   (o) finding process blocks in the IC design which invokes user-defined tasks and/or functions that have a side-effect, and collecting triggering conditions of these process blocks;
   (p) checking any concurrent invocation race of the tasks and/or functions that have a side-effect, by justifying that two sets of triggering conditions from any two process blocks are compatible simultaneously.

15. The method of claim 14 wherein the operation of (n) further comprises checking all user-defined tasks and functions in the IC design, and identifying those tasks and functions that modify and/or reference external signals or registers that are defined beyond the scope of the tasks and functions.

16. The method of claim 14 wherein the triggering conditions comprise: trigger signals to the process block; trigger event types; and any delays in invoking the user-defined tasks or functions.

17. The method of claim 16 wherein the operation of (p) further comprises proving following conditions between the triggering conditions of two process blocks are true during an IC operation including trigger signals of the two process blocks are either the same signal or are two independent signals which states are controlled independently via input stimuli to the IC design.

18. The method of claim 2 wherein the operation of (d) further comprises ignoring user-defined tasks and functions that have no side-effect.

19. The method of claim 2 wherein the operation of (e) further comprises detecting zero-delay combinational feedback loops in an IC design.

20. The method of claim 19 further comprising tracing each signal or register in an IC design that has both driving and driven process blocks to determine if a signal or register object is involved in one or more combinational feedback loops.

21. The method of claim 20 further comprising:
   (q) selecting a signal or register as a target object;
   (r) setting the target object as a current trace object;
   (s) collecting driving conditions of each driving process block of the current trace object;
   (t) determining which driving process blocks of the current trace object will allow path tracing to traverse through the blocks and continue via one or more of input signals of those driving blocks;
   (u) for every input signal of a driving process where path tracing to be traversed, setting the input signal of the driving process as the current trace object;
   (v) checking if a current trace signal is the same as the target object and if so, reporting a combination loop to users.

22. The method of claim 21 wherein the driving conditions comprise: trigger signals of the process block; trigger event types; any delays in assigning a new state to the current trace object; an assignment type to be made; any inversion polarity of the assignment; data to be assigned to the current trace object; and any enabling conditions for the assignment.

23. The method of claim 22 wherein the operation of (v) further comprises checking the driving conditions of each driving process block of the current trace object, and determining whether the path tracing can traverse through the process block.

24. The method of claim 21 wherein the operation of (v) further comprises confirming a potentially combinational feedback loop in an IC design is detected if the loop tracing for a selected signal or register successfully traversed one or more process blocks in the IC design and terminated at reaching the same selected signal or register in the tracing process.

25. The method of claim 1 wherein the operation of (ii) further comprises running an event-driven HDL simulation kernel, based on a user-supplied test bench, and detecting the following race events at every simulation time point of the IC design:
   (w) analyzing circuit signals and registers that are changing states and detecting concurrent assignment races;
   (x) analyzing circuit signals and registers that are changing states and/or being referenced, and detecting concurrent assignment and reference races;
   (y) analyzing circuit process blocks which invoke HDL-defined system functions and/or tasks that have side-effects, and detecting concurrent invocation races for the HDL-defined system functions and/or tasks;
   (z) analyzing circuit process blocks which invoke user-defined tasks and functions that have side-effects, and detecting concurrent invocation of the HDL-defined functions and/or tasks that render in concurrent assignment races, concurrent assignment and reference races, and/or concurrent invocation races of the user-defined system functions and/or tasks.

26. The method of claim 25 wherein the operations of (w) and (x) further comprise keeping track of each circuit signal or register object in an IC design when they are assigned new states or being referenced.

27. The method of claim 25 wherein the operation of (w) further comprises detecting a concurrent assignment race of a signal or register object in an IC design, when two assignment events are found to occur on the same object, at a same simulation time point, and by two unrelated process blocks.

28. The method of claim 25 wherein the operation of (x) further comprises a step of detecting a concurrent assignment and reference race on a signal or register object in an IC design, when an assignment and a reference event are found to occur on the same object, at a same simulation time point, and by two unrelated process blocks.

29. The method of claim 25 wherein the operation of (y) further comprises detecting concurrent invocation of HDL-defined system functions and/or tasks by keeping track of each process block in an IC design that invokes the HDL-defined system functions and/or tasks that have a side-effect, and a simulation time when that occur.

30. The method of claim 25 wherein the operation of (y) further comprises detecting a concurrent invocation of same HDL-defined system functions and/or tasks when two or more unrelated process blocks in an IC design are found to invoke the HDL-defined system functions and/or tasks at a same simulation time point.

31. The method of claim 25 wherein the operation of (z) further comprises identifying user-defined tasks and functions in an IC design that have a side-effect.

32. The method of claim 25 wherein the operation of (z) further comprises keeping track of all process blocks in an IC design which invoke the user-defined tasks and functions with side-effects, and the simulation time when that occur.

33. The method of claim 25 wherein the operation of (z) further comprises detecting when two or more unrelated process blocks in an IC design are found to invoke either the same or different user-defined tasks and/or functions that have a side-effect, at the same simulation time point, and that those tasks and/or functions modify or reference one or more of same external signals or registers, or invoke other HDL-defined system functions and/or tasks that have side-effects simultaneously.

34. The method of claim 25 wherein the operation of (z) further comprises ignoring user-defined tasks and functions that have no side-effect.

35. A machine-readable medium having instructions stored therein, which when executed by a processor, cause the processor to perform a method of performing race logic analysis on an integrated circuit (IC) design, the method comprising:
  (i) compiling HDL (hardware description language) design source files of an IC design into a common design database, including recording full timing information of the IC design;
  (ii) performing at least one of a static race logic analysis on the common design database to reveal all possible race logic in the IC design and a dynamic race logic analysis on the common design database to reveal times and circuit locations where the race logic would occur when a physical IC chip for the IC design is operating in field operations; and
  (iii) generating a race logic analysis report for the static and dynamic race logic analysis, wherein the race logic analysis report is used to reduce race logic errors in the IC design.

36. A data processing system, comprising:

a processor; and a memory coupled to the processor for storing instructions, which when executed from the memory, cause the processor to perform a method, the method including:
  (i) compiling HDL (hardware description language) design source files of an IC design into a common design database, including recording full timing information of the IC design;
  (ii) performing at least one of a static race logic analysis on the common design database to reveal all possible race logic in the IC design and a dynamic race logic analysis on the common design database to reveal times and circuit locations where the race logic would occur when a physical IC chip for the IC design is operating in field operations; and
  (iii) generating a race logic analysis report for the static and dynamic race logic analysis, wherein the race logic analysis report is used to reduce race logic errors in the IC design.

* * * * *